United States Patent
Tiwari et al.

(10) Patent No.: US 7,747,425 B1
(45) Date of Patent: Jun. 29, 2010

(54) SYSTEM AND METHOD FOR PEAK CURRENT MODELING FOR AN IC DESIGN

(75) Inventors: Vipin Kumar Tiwari, Fremont, CA (US); Manish Bhatia, Fremont, CA (US); Abhijit Ray, Sunnyvale, CA (US)

(73) Assignee: Virage Logic Corp., Fremont, CA (US)

( * ) Notice: Subject to any disclaimer, the term of this patent is extended or adjusted under 35 U.S.C. 154(b) by 681 days.

(21) Appl. No.: 11/593,729

(22) Filed: Nov. 7, 2006

Related U.S. Application Data (60) Provisional application No. 60/758,017, filed on Jan. 11, 2006.

(51) Int. Cl.
*G06F 17/50* (2006.01)
(52) U.S. Cl. .............. 703/14; 703/2; 703/13; 703/20; 702/64; 702/66; 716/1; 716/5
(58) Field of Classification Search .......... 703/2, 703/13, 14, 17, 20; 716/1, 5, 6; 702/64, 702/66
See application file for complete search history.

(56) References Cited

U.S. PATENT DOCUMENTS

| | | | |
|---|---|---|---|
| 5,373,457 A | * | 12/1994 | George et al. ............ 703/2 |
| 5,838,579 A | * | 11/1998 | Olson et al. ............. 716/2 |
| 7,421,379 B2 | * | 9/2008 | Levy .................... 703/2 |

OTHER PUBLICATIONS

Greg Blum, "Current Simulation for CMOS Circuits", 1992, Carnegie Mellon Department of Electrical and Computer Engineering, pp. 1-22.*
Alessandro Bogliolo et al., "Gate-Level Current Waveform Simulation of CMOS Integrated Circuits", 1996, ISLPED, pp. 109-112.*
Steven L. Horowitz, "A Syntactic Algorithm for Peak Detection in Waveforms with Applications to Cardiography", 1975, ACM, pp. 281-285.*
Theodosios Pavlidis, "Algorithms for Shape Analysis of Contours and Waveforms", 1980, IEEE, pp. 301-312.*
Chen et al.; "Power Supply Noise Analysis Methodology for Deep-Submicron VLSI Chip Design"; 1997; IBM Research Division; pp. 638-643.

* cited by examiner

*Primary Examiner*—Jason Proctor
(74) *Attorney, Agent, or Firm*—The Danamraj Law Group, P.C.

(57) ABSTRACT

A peak current modeling method and system for modeling peak current demand of an integrated circuit (IC) block such as, e.g., a compilable memory instance. A current demand curve associated with the IC for a particular IC block event is obtained via simulation, for example. A defined time region associated with the particular IC block event is divided into multiple time segments, whereupon at least a first current value and a second current value for each time segment is obtained based on the current demand curve. Thereafter, the current demand curve is approximated, on a segment-by-segment basis, using a select approximate waveform depending on a relationship between the first and second current values.

29 Claims, 6 Drawing Sheets

SYSTEM AND METHOD FOR PEAK CURRENT MODELING FOR AN IC DESIGN

PRIORITY UNDER 35 U.S.C. §119(e) & 37 C.F.R. §1.78

This nonprovisional application claims priority based upon the following prior United States provisional patent application entitled: "PEAK CURRENT MODELING OF MEMORY COMPILERS," Application No. 60/758,017, filed on Jan. 11, 2006, in the name(s) of Vipin Kumar Tiwari, which is hereby incorporated by reference.

CROSS-REFERENCE TO RELATED APPLICATION(S)

This application discloses subject matter related to the subject matter disclosed in the following commonly owned U.S. patent application(s): (i) "SYSTEM AND METHOD FOR APPROXIMATING INTRINSIC CAPACITANCE OF AN IC BLOCK", application Ser. No. 11/614,133 filed Dec. 22, 2006; now U.S. Pat. No. 7,546,136.

BACKGROUND

1. Technical Field

The present disclosure relates generally to semiconductor memories. More particularly, and not by way of any limitation, the present disclosure is directed to a system and method for peak current modeling for an integrated circuit (IC) design involving a compiler, e.g., a memory compiler.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, non-volatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that obtaining accurate peak current estimates with respect to a memory instance is a major factor in designing high performance memories because of the requirement of adequate budgeting of an external decoupling or bypass capacitor that mitigates the parasitic inductive effects caused by the high frequency currents. Given that memories typically experience high current demands for only a short period of time due to simultaneous switching operations in the circuitry (thereby causing the parasitic voltages on the power supply lines), peak current demand requirements need to be estimated accurately as well as efficiently for a particular IC design. This is especially relevant where memory compilers have a wide range of memory configurations and peak current demands need to be estimated for each memory configuration.

SUMMARY

In one aspect, the present disclosure is directed to an embodiment of a peak current modeling method. The claimed method embodiment comprises: obtaining a current demand curve associated with an integrated circuit (IC) block for a particular IC block event; dividing a defined time region associated with the particular IC block event into multiple time segments; obtaining at least one of a first current value and a second current value for each time segment based on the current demand curve; and approximating the current demand curve, on a segment-by-segment basis, using a select approximate waveform depending on a relationship between the first and second current values.

In another aspect, the present disclosure is directed to an embodiment of a computer-implemented system for modeling peak current in an IC block. The claimed system embodiment comprises: means for obtaining a current demand curve associated with the IC block for a particular IC block event; means for dividing a defined time region associated with the particular IC block event into multiple time segments; means for obtaining at least one of a first current value and a second current value for each time segment based on the current demand curve; and means for approximating the current demand curve, on a segment-by-segment basis, using a select approximate waveform depending on a relationship between the first and second current values.

In a still further aspect, the present disclosure is directed to a computer program product operable to be executed in association with a computer system, wherein the computer program product includes instructions for modeling peak current in an IC block. The claimed computer program product comprises: a code portion for dividing a current demand curve associated with a particular IC block event over a defined time region into multiple segments; a code portion for obtaining at least one of a first current value and a second current value for each segment based on the current demand curve; and a code portion for approximating the current demand curve, on a segment-by-segment basis, using a select approximate waveform depending on a relationship between the first and second current values.

BRIEF DESCRIPTION OF THE DRAWINGS

A more complete understanding of the present disclosure may be had by reference to the following Detailed Description when taken in conjunction with the accompanying drawings wherein.

DETAILED DESCRIPTION OF THE DRAWINGS

Figure 1:
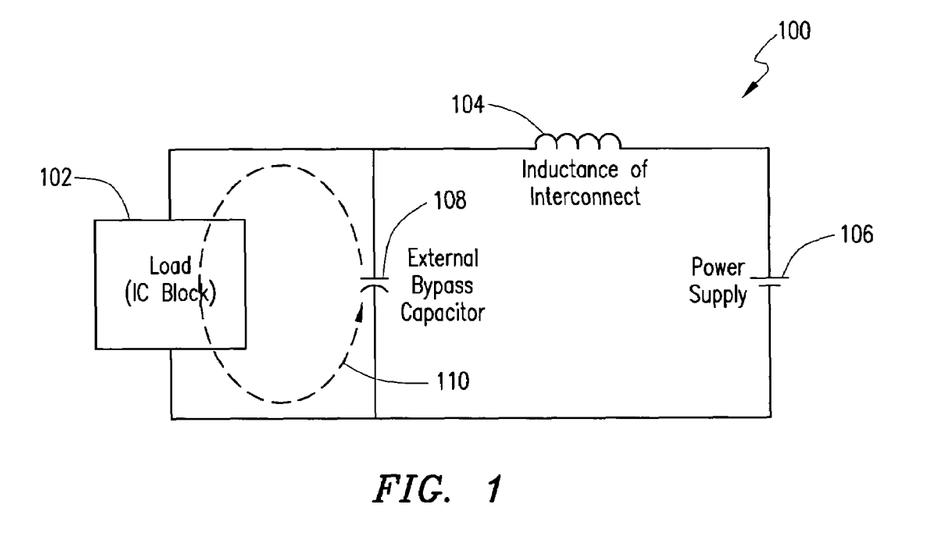
FIG. 1 depicts a high-level circuit abstraction scheme involving an IC block where peak current may be modeled according to one or more embodiments of the present disclosure.

In the drawings, like or similar elements are designated with identical reference numerals throughout the several views thereof, and the various elements depicted are not necessarily drawn to scale. Referring now to FIG. 1, depicted therein is a high-level circuit abstraction scheme 100 involving an IC block 102 where peak current may be modeled according to one or more embodiments of the present disclosure. At the outset, those skilled in the art should recognize that IC block 102 may be comprised of any electronic integrated circuitry, e.g., a compilable memory instance of any known or heretofore unknown functionality, technology, and/or process, wherein peak current demand is to be modeled efficiently as well as with acceptable levels of accuracy so that a suitable external bypass capacitance 108 may be budgeted accordingly. A power supply 106 is operable to provide current in order for driving the circuitry of IC block 102. As alluded to in the Background section of the present disclosure, circuitry such as IC block 102 typically demands high currents in a bursty fashion for short periods of time because of simultaneous switching of a large number of internal capacitors. At high frequencies, power supply buses (i.e., interconnect) of the circuitry operate as parasitic inductors that tend to induce a voltage of opposite polarity on the power supply buses, which may be modeled as a lumped parasitic inductor 104 in the circuit abstraction scheme 100 shown in FIG. 1. In addition, reference numeral 110 illustratively refers to a return path of current at high frequencies that counteracts normal current flows in the circuitry of IC block 102.

The embodiments of the present disclosure utilize the observation that peak current demand is typically triggered by certain operations or events (referred to herein as IC block events) associated with IC block 102. In the context of a memory instance, such events may comprise, e.g., wordline switching, bitline switching, and the like, associated with a memory read or write operation. Accordingly, the time duration associated with an IC block event may be segmented appropriately with sufficient granularity such that a current demand curve may be modeled accurately and efficiently in order to estimate IC block's peak current requirements for purposes of designing the bypass capacitance.

Figure 2A:
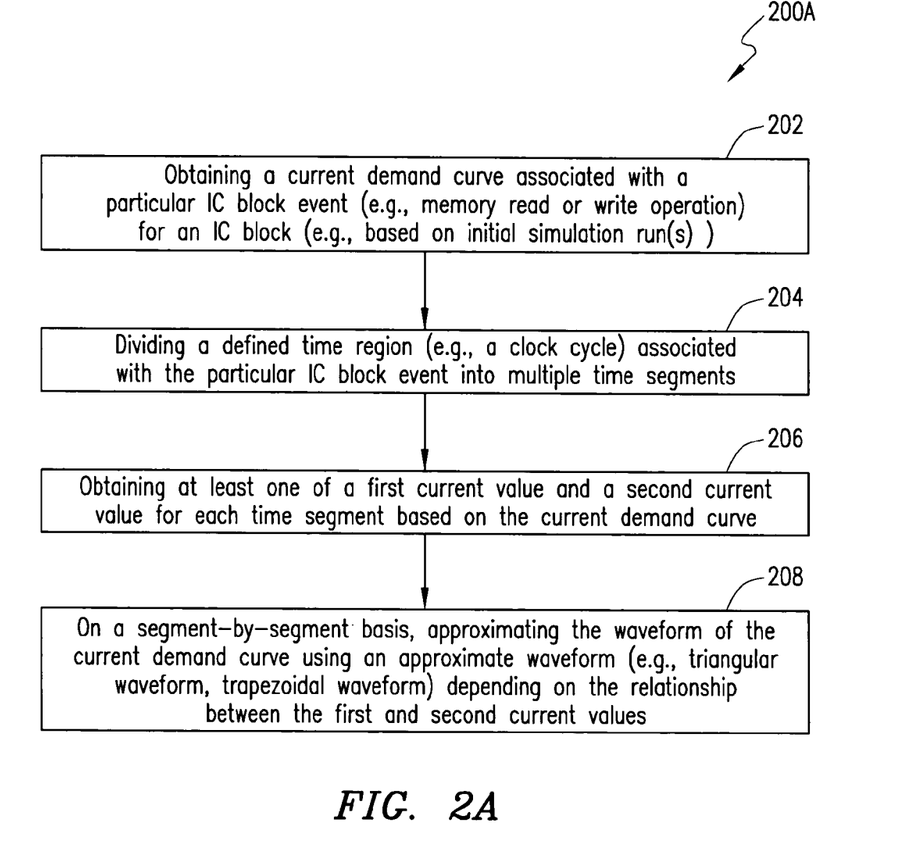
FIG. 2A is a flowchart of a peak current modeling scheme in one embodiment.

FIG. 2A is a flowchart of a peak current modeling scheme 200A in accordance with one embodiment. As illustrated in block 202, a current demand curve associated with a particular IC block event for an IC block may be obtained based on initial simulation of the circuitry thereof. In one implementation, the IC block may be simulated by SPICE to obtain the current demand over a period of time. Thereafter, a defined time region (e.g., a memory clock cycle) associated with the particular IC block event may be divided into multiple time segments (block 204), which results in partitioning of the current demand curve into corresponding curve segments. By way of illustration with respect to a typical write cycle of a memory instance, the clock cycle may be divided into the following parts: (a) clock to wordline rising; (b) wordline rising to wordline falling; (c) wordline falling to $T_{cc}$; and (d) $T_{cc}$ to the end of simulation clock cycle, where $T_{cc}$=minimum clock cycle for the particular memory instance being characterized. Those skilled in the art will recognize, however, that the memory cycle partitioning set forth herein is not a fixed scheme. Rather, it is merely exemplary and may preferably be design-dependent based on the switching activity of the memory under design.

For each segment, certain current parameters are obtained based on the measurements with respect to the current demand curve. In accordance with the teachings herein, at least one of a first current value comprising an average current value and a second current value comprising a peak current value for each segment is obtained (block 206). In some cases, it may not be necessary to obtain both current values for a particular segment. With respect to the memory write cycle example set forth hereinabove, it is usually sufficient to measure only the average current value during the segment comprising $T_{cc}$ to end of simulation clock cycle. Thereafter, the waveform is approximated on a segment-by-segment basis using certain standard waveform representations, depending upon the relationship between the first and second current values (block 208). The approximated waveform may then be provided to a designer for facilitating the design of an external bypass capacitor for the particular IC block.

Figure 2B:
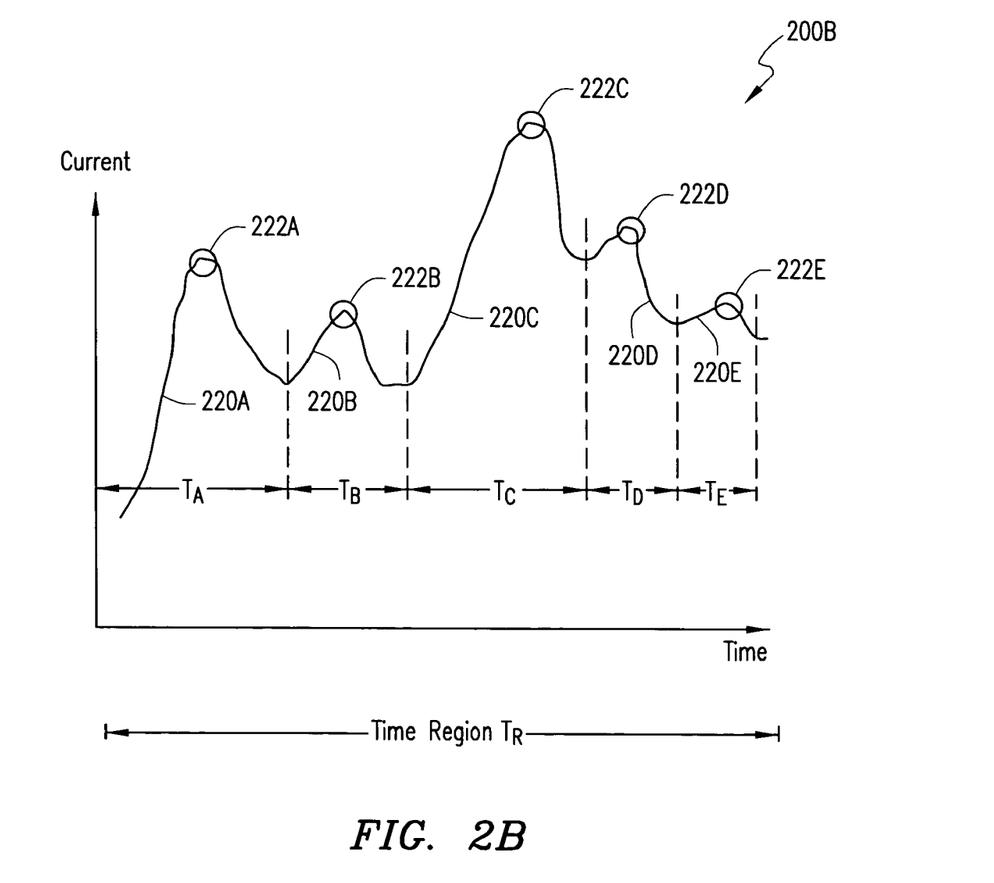
FIG. 2B is an exemplary current demand curve associated with an IC block.

FIG. 2B is an exemplary current demand curve 200B associated with an IC block. As alluded to previously, the waveform 200B may be obtained based on an initial simulation of the circuitry, which may be a compilable memory instance having a variable topology and configuration. A time region $T_R$ that comprises a simulation cycle may be divided into a plurality of segments, e.g., $T_A$ through $T_E$, which results in a corresponding number of segments of the current demand curve. In one embodiment, $T_R$ may be segmented such that each resulting segment includes at least one local current peak. By way of illustration, segment $T_A$ includes a curve segment 220A having a peak 222A. In similar fashion, segment $T_B$ includes a curve segment 220B with peak 222B; segment $T_C$ includes a curve segment 220C with peak 222C; segment $T_D$ includes a curve segment 220D with peak 222D; and segment $T_E$ includes a curve segment 220E having peak 222E. As will be described in detail below, each curve segment is then modeled with a select approximate waveform such that a local peak of the current demand curve occurring during the time segment is substantially aligned with a peak of the approximate waveform.

Figure 3:
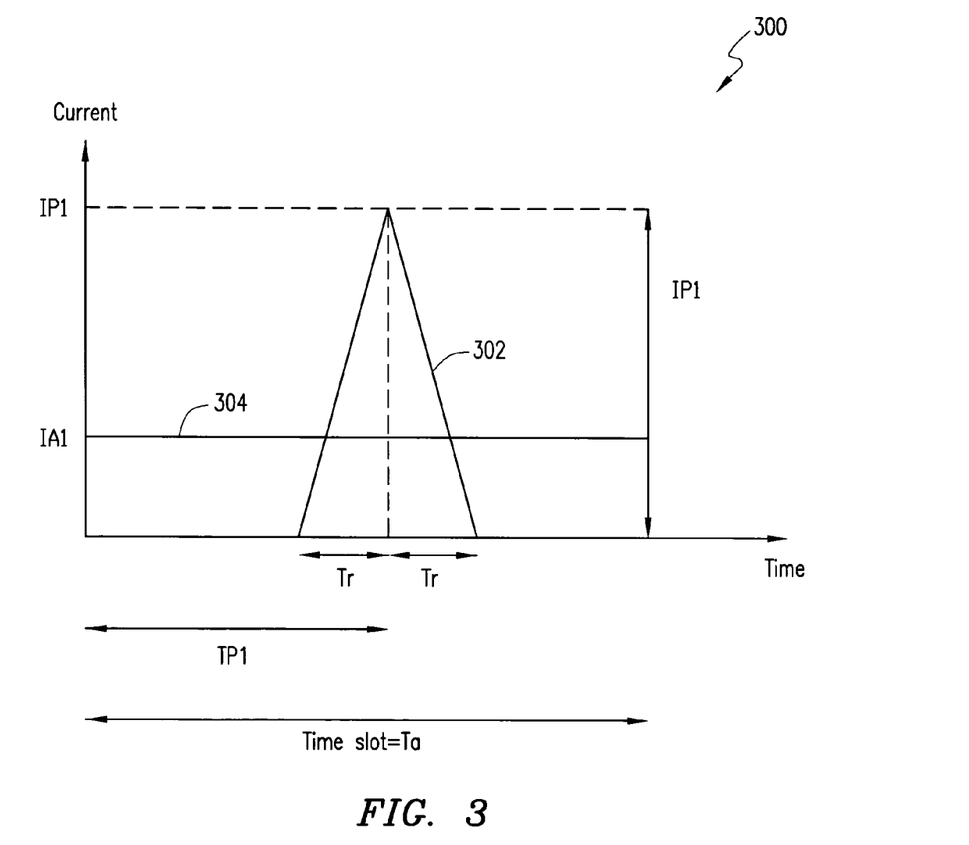
FIG. 3 depicts a triangular waveform model for approximating at least a portion of a current demand curve according to one embodiment.

FIG. 3 depicts a triangular waveform model 300 for approximating a particular segment of a current demand curve according to one embodiment. In accordance with the teachings herein, a triangular waveform 302 may be selected for modeling at least a segment of the current demand curve if an average current value (IA1) for the segment is less than half of a peak current value (IP1) associated therewith. When this condition is satisfied, it is indicative that the current demand waveform includes a peak that occurs for a relatively narrow duration of the segment and the current is comparatively low for the remainder of the segment. Accordingly, the triangular waveform 302 is selected such that it is centered around the time where the local peak, i.e., IP1, occurs. Additionally, a further assumption may be made that the rise and fall times are equal (i.e., $T_r=T_f$), although it not a necessary requirement.

As illustrated in FIG. 3, IA1 (the average current during the time slot) is represented by a straight line 304. With respect to the select triangular waveform 302, $T_r$ is the rise time of the peak current, $T_a$ is the exemplary time slot or segment, IP1 is the peak current during $T_a$, and TP1 is the time to peak. In accordance with the underlying physical principles, total charge Q during $T_a$ is the same for both current waveforms (i.e., average current 304 and triangular waveform 302). Accordingly, the respective areas under these two waveforms should also be equal. Therefore, it can be seen that:

$$[\tfrac{1}{2}][2T_r][IP1]=[IA1][T_a]$$

The values of IA1, IP1 and $T_a$ are already known. Therefore, the rise time $T_r$ of the triangular waveform 302 is given by:

$$T_r=[(IA1)(T_a)]/IP1$$

which adequately characterizes the current demand curve for the time segment under consideration.

Figure 4:
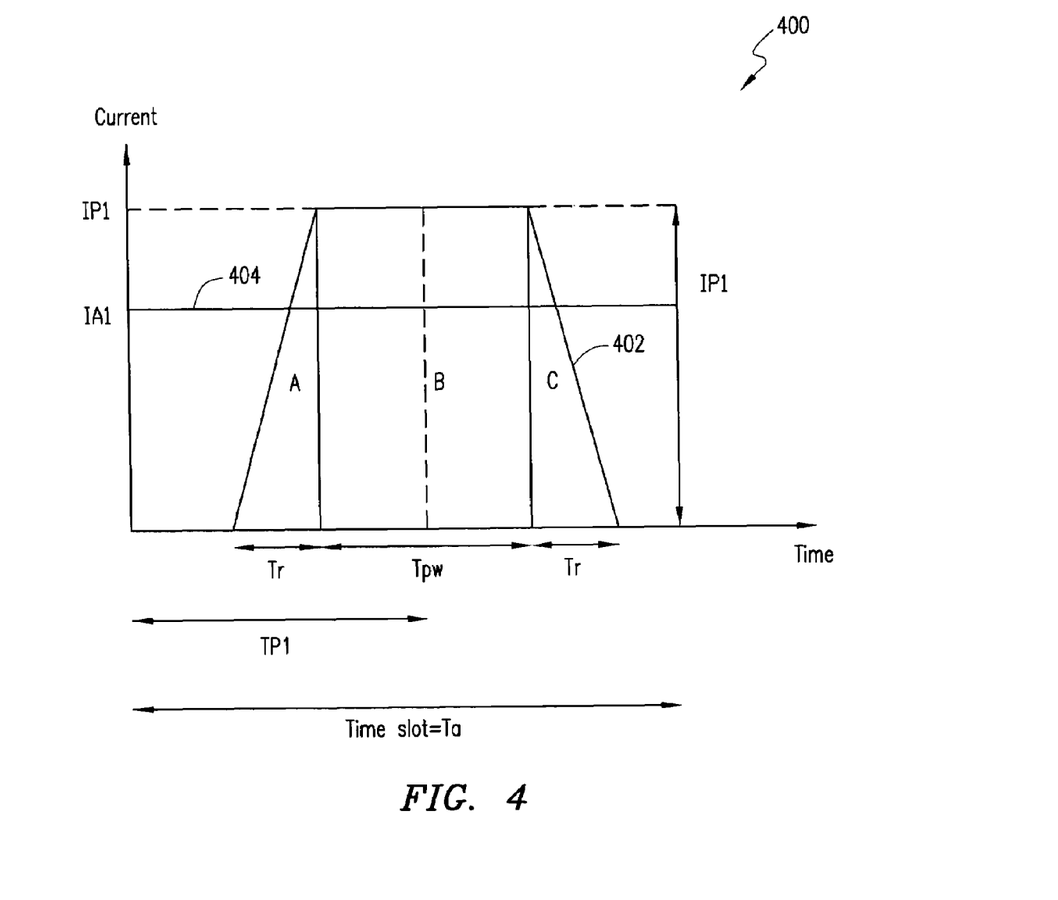
FIG. 4 depicts a trapezoidal waveform model for approximating at least a portion of a current demand curve according to one embodiment.

FIG. 4 depicts a trapezoidal waveform model 400 for approximating a particular segment of a current demand curve according to another embodiment. Similar to the treatment above, a trapezoidal waveform 402 may be selected for modeling at least a segment of the current demand curve if an average current value (IA1) for the segment is greater than or equal to half of a peak current value (IP1) associated therewith. When this condition is satisfied, it is indicative that the current waveform includes a peak that occurs for a relatively broad time period of the segment as compared to the duration of the segment. Accordingly, the trapezoidal waveform 402 is selected such that it is centered around the time (TP1) where the local peak, i.e., IP1, occurs. Additionally, similar to the triangular waveform model described above, a further assumption may be made that the rise and fall times are equal (i.e., $T_r=T_f$), although it not a necessary requirement.

As illustrated in FIG. 4, IA1 (the average current during the time slot) is represented by a straight line 404. With respect to the trapezoidal waveform 402, $T_r$ is the rise time of the peak current, $T_a$ is the exemplary time slot or segment, IP1 is the peak current during $T_a$, $T_{pw}$ is the duration of the peak, and TP1 is the time to peak. Again, total charge Q during $T_a$ should be the same for both current waveforms (i.e., average current 404 and trapezoidal waveform 302). Accordingly, the respective areas under these two waveforms should also be equal. Therefore, it can be seen that:

$$[T_{pw}][IP1]+[\tfrac{1}{2}][2T_r][IP1]=[IA1][T_a]=>[IP1][T_r+T_{pw}]=[IA1][T_a]=>[T_r+T_{pw}]=[IA1][T_a]/[IP1]$$

The values of IA1, IP1 and $T_a$ are already known. Assuming that $T_r$ is some fraction $\alpha$ of $T_{pw}$, therefore, the rise time $T_r$ of the triangular waveform 302 is given by:

$$T_r=[\alpha/(\alpha+1)][(IA1)(T_a)]/IP1, \text{ where } \alpha<1$$

which adequately characterizes the current demand curve for the time segment under consideration.

Once a current demand curve is appropriately modeled for an IC block, such information may be utilized in conjunction with a model that describes the IC block's intrinsic capacitance in designing an external bypass capacitor for the IC block such that peak current demand is adequately met during high frequency switching operations. Additional details regarding the modeling of intrinsic capacitance of an IC block may be found in the following co-pending commonly assigned U.S. patent application entitled "SYSTEM AND METHOD FOR APPROXIMATING INTRINSIC CAPACITANCE OF AN IC BLOCK", application Ser. No. 11/614,133 filed Dec. 22, 2006; now U.S. Pat. No. 7,546,136.

Figure 5:
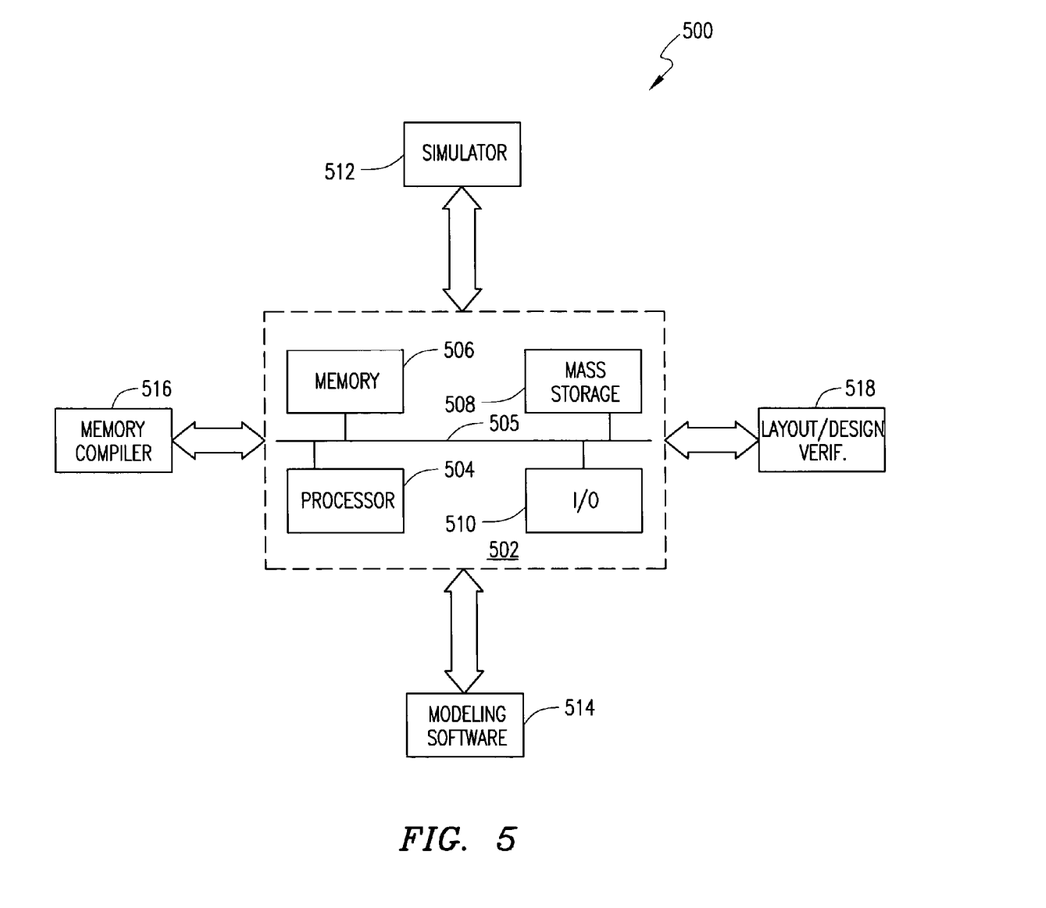
FIG. 5 depicts a computer system operable to implement the peak current modeling scheme in accordance with an embodiment of the present disclosure.

FIG. 5 depicts a computer system 500 operable to implement the peak current modeling scheme in accordance with an embodiment of the present disclosure. A suitable hardware platform 502 includes one or more processors 504, one or more memory blocks 506, one or more mass storage units 508 and one or more input/output (I/O) blocks 510, all interconnected together via a bus system 505. A simulator 512 is operable to perform circuit simulations using applicable software, e.g., SPICE, with respect to a particular IC block being characterized. Also included are a memory compiler 516 for compiling memory instances of variable topologies/configurations as well as a layout/design verification module 518. Modeling software 514 is preferably operable to effectuate one or more of the following processes: dividing a defined time region associated with a particular IC block event into multiple time segments for which a current demand curve is obtained; obtaining at least one of a first current value and a second current value for each time segment based on the current demand curve; and approximating the current demand curve, on a segment-by-segment basis, using a select approximate waveform depending on a relationship between the first and second current values, which have been described in detail hereinabove.

Based on the foregoing, it should be appreciated that the present disclosure provides a simpler yet effective methodology than a piecewise linear approximation approach for characterizing IC designs in terms of their peak current demand requirements. Since the entire VDD/VSS rail data for an IC block need not be extracted, the resultant netlist can be relatively small, which facilitates more manageable simulations. In addition, the scheme set forth herein is versatile enough that it is amenable to dividing the clock cycles in a design-specific manner, especially where compilable memory instances of various topologies, configurations, technologies, etc. may be involved.

It is believed that the operation and construction of the present disclosure will be apparent from the foregoing Detailed Description. While some aspects of the method and circuitry shown and described may have been characterized as being preferred, it should be readily understood that various changes and modifications could be made therein without departing from the scope of the present disclosure as set forth in the following claims.

What is claimed is:

1. A peak current modeling method, executing on a computer system, the method comprising:
   obtaining a current demand curve associated with an integrated circuit (IC) block for a particular IC block event;
   dividing a defined time region associated with said particular IC block event into multiple time segments such that each time segment includes a local peak of said current demand curve;
   obtaining at least one of a first current value and a second current value for each time segment based on said current demand curve; and
   approximating said current demand curve, on a segment-by-segment basis, using a select approximate waveform depending on a relationship between said first and second current values.

2. The peak current modeling method as set forth in claim 1, wherein said particular IC block event comprises a memory write cycle operation.

3. The peak current modeling method as set forth in claim 1, wherein said particular IC block event comprises a memory read cycle operation.

4. The peak current modeling method as set forth in claim 1, wherein said current demand curve is obtained by an initial simulation of said IC block.

5. The peak current modeling method as set forth in claim 4, wherein said initial simulation is performed using SPICE.

6. The peak current modeling method as set forth in claim 1, wherein said defined time region comprises a single clock cycle.

7. The peak current modeling method as set forth in claim 1, wherein said first current value comprises an average current value and said second current value comprises a peak current value for a particular time segment.

8. The peak current modeling method as set forth in claim 7, wherein said select approximate waveform comprises a triangular waveform if said average current value is less than half of said peak current value.

9. The peak current modeling method as set forth in claim 7, wherein said select approximate waveform comprises a trapezoidal waveform if said average current value is greater than or equal to half of said peak current value.

10. The peak current modeling method as set forth in claim 1, wherein said current demand curve is approximated for a particular time segment by said select approximate waveform such that a local peak of said current demand curve occurring during said particular time segment is substantially aligned with a peak of said select approximate waveform.

11. The peak current modeling method as set forth in claim 1, wherein said multiple time segments are of substantially equal duration.

12. The peak current modeling method as set forth in claim 1, wherein said IC block comprises a compilable memory instance.

13. A computer-implemented system for modeling peak current in an integrated circuit (IC) block, comprising:
   a processor;
   a memory configured to be accessed by said processor and containing instructions, wherein said instructions include instructions for obtaining a current demand curve associated with said IC block for a particular IC block event, instructions for dividing a defined time region associated with said particular IC block event into multiple time segments such that each time segment comprises a local peak of said current demand curve, instructions for obtaining at least one of a first current value and a second current value for each time segment based on said current demand curve, and instructions for approximating said current demand curve, on a segment-by-segment basis, using a select approximate waveform depending on a relationship between said first and second current values.

14. The computer-implemented system for modeling peak current in an IC block as set forth in claim 13, wherein said particular IC block event comprises a memory write cycle operation.

15. The computer-implemented system for modeling peak current in an IC block as set forth in claim 13, wherein said particular IC block event comprises a memory read cycle operation.

16. The computer-implemented system for modeling peak current in an IC block as set forth in claim 13, wherein said means for obtaining said current demand curve comprises a SPICE simulator.

17. The computer-implemented system for modeling peak current in an IC block as set forth in claim 13, wherein said defined time region comprises a single clock cycle.

18. The computer-implemented system for modeling peak current in an IC block as set forth in claim 13, wherein said first current value comprises an average current value and said second current value comprises a peak current value for a particular time segment.

19. The computer-implemented system for modeling peak current in an IC block as set forth in claim 18, wherein said select approximate waveform comprises a triangular waveform if said average current value is less than half of said peak current value.

20. The computer-implemented system for modeling peak current in an IC block as set forth in claim 18, wherein said select approximate waveform comprises a trapezoidal waveform if said average current value is greater than or equal to half of said peak current value.

21. The computer-implemented system for modeling peak current in an IC block as set forth in claim 13, wherein said current demand curve is approximated for a particular time segment by said select approximate waveform such that a local peak of said current demand curve occurring during said particular time segment is substantially aligned with a peak of said select approximate waveform.

22. The computer-implemented system for modeling peak current in an IC block as set forth in claim 13, wherein said multiple time segments are of substantially equal duration.

23. A computer-readable medium on which is stored a computer program product operable to be executed in association with a computer system, said computer program product having instructions for modeling peak current in an integrated circuit (IC) block, comprising:
   a code portion for dividing a current demand curve associated with a particular IC block event over a defined time region into multiple segments such that each segment includes a local peak of said current demand curve;
   a code portion for obtaining at least one of a first current value and a second current value for each segment based on said current demand curve; and
   a code portion for approximating said current demand curve, on a segment-by-segment basis, using a select approximate waveform depending on a relationship between said first and second current values.

24. The computer program product as set forth in claim 23, wherein said particular IC block event comprises a memory write cycle operation.

25. The computer program product as set forth in claim 23, wherein said particular IC block event comprises a memory read cycle operation.

26. The computer program product as set forth in claim 23, wherein said defined time region comprises a single clock cycle.

27. The computer program product as set forth in claim 23, wherein said first current value comprises an average current value and said second current value comprises a peak current value for a particular time segment.

28. The computer program product as set forth in claim 23, wherein said code portion for approximating said current demand curve includes a code portion for applying a triangular waveform if said average current value is less than half of said peak current value.

29. The computer program product as set forth in claim 23, wherein said code portion for approximating said current demand curve includes a code portion for applying a trapezoidal waveform if said average current value is greater than or equal to half of said peak current value.

* * * * *